(12) United States Patent
Hsieh et al.

(10) Patent No.: US 8,581,384 B2
(45) Date of Patent: Nov. 12, 2013

(54) SEMICONDUCTOR PACKAGE STRUCTURE

(75) Inventors: Chin-Tang Hsieh, Kaohsiung (TW);
Chih-Ming Kuo, Hsinchu County (TW);
Chia-Jung Tu, Hsinchu County (TW);
Shih-Chieh Chang, Chiayi County (TW); Lung-Hua Ho, Hsinchu (TW);
Chih-Hsien Ni, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/426,804

(22) Filed: Mar. 22, 2012

(65) Prior Publication Data

US 2013/0249070 A1    Sep. 26, 2013

(51) Int. Cl.
*H01L 23/48*        (2006.01)

(52) U.S. Cl.
USPC .................................... 257/692; 438/106

(58) Field of Classification Search
USPC ......... 257/678, 778, 787, 687, 690, 692, 693, 257/700, 666, 667, 676, E21.001, E23.141, 257/E21.499, E23.114, E23.031, E23.061, 257/E23.046, E23.043; 438/124, 123, 106, 438/127

See application file for complete search history.

(56) References Cited

U.S. PATENT DOCUMENTS

| 2006/0017173 A1* | 1/2006 | Wu et al. ........................ 257/778 |
| 2007/0034994 A1* | 2/2007 | Choi .............................. 257/666 |
| 2009/0215244 A1* | 8/2009 | McKerreghan et al. ...... 438/462 |

* cited by examiner

*Primary Examiner* — Steven Loke
*Assistant Examiner* — Mouloucoulaye Inoussa
(74) *Attorney, Agent, or Firm* — Jackson IPG PLLC

(57) ABSTRACT

A semiconductor package structure comprises a lead frame, at least one chip, a molding compound and an anti-conduction film. The lead frame comprises a plurality of leads, each of the leads comprises a first end portion and a second end portion, wherein the first end portion comprises a first upper surface and a first lower surface, and the second end portion comprises a second upper surface and a second lower surface. The chip comprises a plurality of bumps electrically connected with the lead frame. The chip and the leads are covered with the molding compound. The first lower surface of each of the first end portions and the second lower surface of each of the second end portions are exposed by the molding compound. The first lower surface of the first end portion of each of the leads is covered with the anti-conduction film.

6 Claims, 2 Drawing Sheets

SEMICONDUCTOR PACKAGE STRUCTURE

FIELD OF THE INVENTION

The present invention is generally related to a semiconductor package structure, which particularly relates to the semiconductor package structure having an anti-conduction film.

BACKGROUND OF THE INVENTION

For prevention of unnecessary electrical connections between a lead frame and other electronic devices, a half-etched process is commonly used for thinning the front sections of leads in the lead frame to make the front sections of leads covered with a molding compound to lower the contact probability with other electronic devices. However, when a chip is coupled to the lead frame, the front sections of leads can not bear the coupling pressure and likely lead a deformation in this package structure.

SUMMARY

The primary object of the present invention is to provide a semiconductor package structure comprising a lead frame, at least one chip, a molding compound and an anti-conduction film. The lead frame comprises a plurality of leads, each of the leads comprises a first end portion, a second end portion and a half-etched portion in connection with the first end portion and the second end portion, wherein the first end portion comprises a first upper surface and a first lower surface, the second end portion comprises a second upper surface and a second lower surface, and the half-etched portion comprises a third upper surface and a third lower surface. The chip is disposed on top of the leads and comprises an active surface and a plurality of bumps disposed on the active surface. The active surface faces toward the first upper surfaces of the first end portions, and the bumps are electrically connected with the lead frame. The chip and the leads are covered with the molding compound. The first lower surface of each of the first end portions and the second lower surface of each of the second end portions are exposed by the molding compound. The first lower surface of the first end portion of each of the leads is covered with the anti-conduction film. In this invention, the first end portions of the lead frame do not undergo a half-etched process, which may enhance the supporting strength of the lead frame coupled to the chip. In addition, owning to the reason that the first lower surface of the first end portion of each of the leads is covered with the anti-conduction film, the reliability of the semiconductor package structure improves effectively. Besides, the second lower surfaces of the second end portions are uncovered to raise electricity conductivity and heat conductivity for semiconductor package structure. Alternatively, mentioned second end portions may also arrange to stack with electronic devices or other semiconductor package structure so as to form an electrical connection.

DETAILED DESCRIPTION OF THE INVENTION

Figure 1:
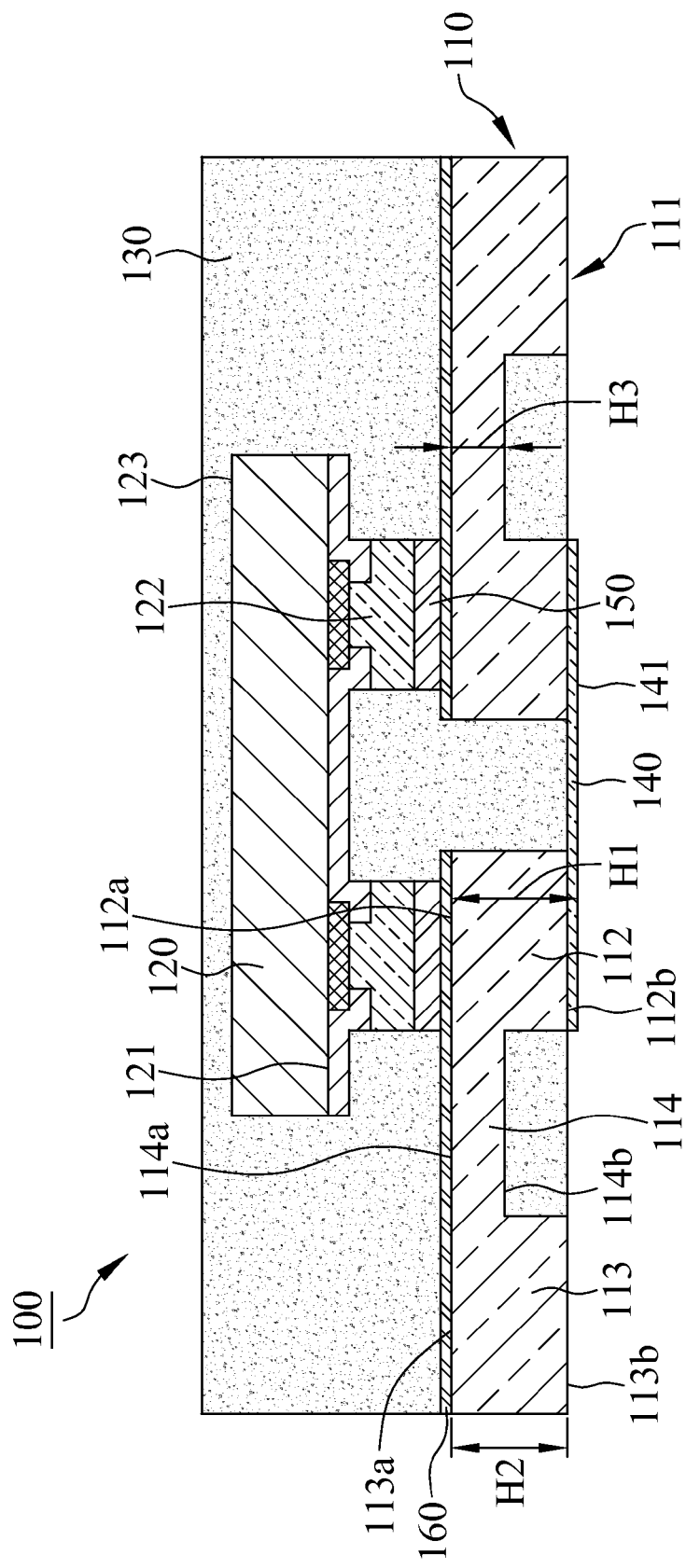
FIG. 1 is a section diagram illustrating a semiconductor package structure in accordance with a preferred embodiment of the present invention.
Figure 2:
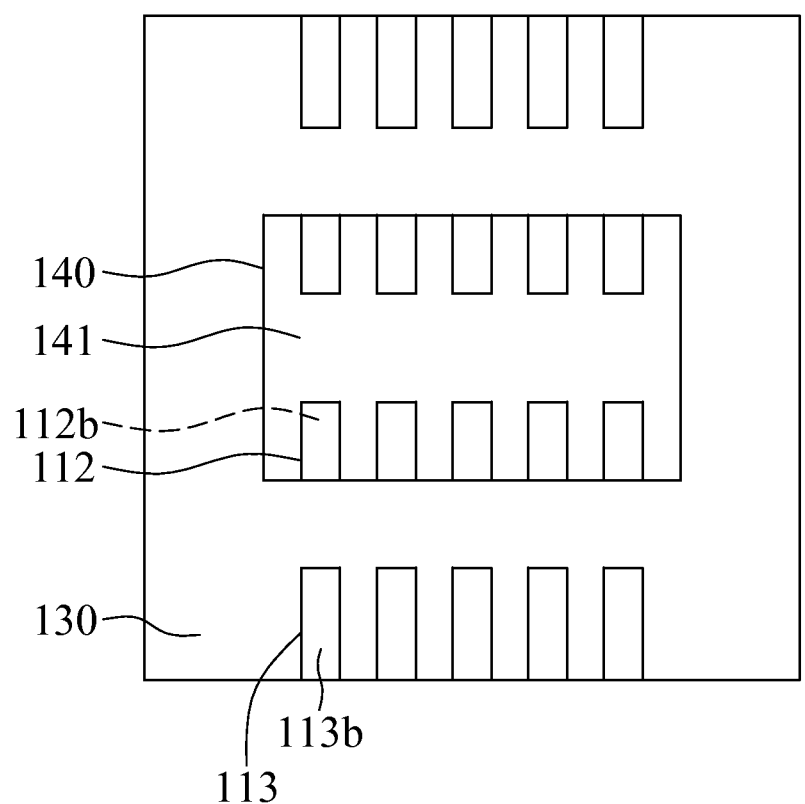
FIG. 2 is a bottom view illustrating the semiconductor package structure in accordance with a preferred embodiment of the present invention.

With reference to FIGS. 1 and 2, a semiconductor package structure 100 in accordance with a preferred embodiment of the present invention comprises a lead frame 110, at least one chip 120, a molding compound 130, an anti-conduction film 140 and a plurality of solder 150. The lead frame 110 comprises a plurality of leads 111, wherein each of the leads 111 comprises a first end portion 112, a second end portion 113, and a half-etched portion 114 in connection with the first end portion 112 and the second end portion 113. The first end portion 112 comprises a first upper surface 112a and a first lower surface 112b, the second end portion 113 comprises a second upper surface 113a and a second lower surface 113b, and the half-etched portion 114 comprises a third upper surface 114a and a third lower surface 114b. The chip 120 comprises an active surface 121, a plurality of bumps 122 disposed on the active surface 121 and a rear surface 123, wherein the active surface 121 faces toward the first upper surfaces 112a of the first end portions 112, and the bumps 122 are electrically connected with the lead frame 110. In this embodiment, the bumps 122 are made of a material selected from one of gold, copper, copper/nickel, copper/nickel/gold and non-metal bump. The chip 120 and the leads 111 are covered with the molding compound 130. The first lower surface 112b of each of the first end portions 112 and the second lower surface 113b of each of the second end portions 113 are exposed by the molding compound 130. The first lower surface 112b of the first end portion 112 of each of the leads 111 are covered with the anti-conduction film 140 to prevent a short phenomenon from happening such that the reliability of the semiconductor package structure 100 improves effectively.

With reference to FIGS. 1 and 2 again, in this embodiment, the material of the anti-conduction film 140 can be a polymer material with high resistance. The anti-conduction film 140 comprises an exposing surface 141, wherein the first upper surface 112a of each of the first end portions and the exposing surface 141 have a first thickness H1. Each of the second end portions 113 further comprises a second thickness H2 between the second upper surface 113a and the second lower surface 113b. Each of the half-etched portions 114 further comprises a third thickness H3 between the third upper surface 114a and the third lower surface 114b. In this embodiment, the first thickness H1 is larger than the second thickness H2, and the second thickness H2 is larger than the third thickness H3. The solder 150 are electrically connected with the bumps 122 and the lead frame 110. Besides, the semiconductor package 100 further comprises a connection layer 160 formed on the first upper surfaces 112a of the first end portions 112, the second upper surfaces 113a of the second end portions 113 and the third upper surface 114a of the half-etched portions 114. The connection layer 160 is made of a material selected from one of nickel/lead/gold, silver and tin/silver.

In this invention, the first end portions 112 of the lead frame 110 do not undergo a half-etched process, which may enhance the supporting strength of the lead frame coupled to the chip. In addition, the chip 120 and the lead frame 110 are connected with each other via the solder 150 and the connection layer 160 to simplify the process of the semiconductor package structure 100. Besides, the second lower surfaces 113b of the second end portions 113 are uncovered to raise electricity conductivity and heat conductivity for semiconductor package structure 100. Alternatively, mentioned second end portions 113 may also arrange to stack with electronic devices or other semiconductor package structure so as to form an electrical connection.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor package structure at least comprising:
   a lead frame having a plurality of leads, wherein each of the leads comprises:
      a first end portion,
      a second end portion and
      a half-etched portion in connection with the first end portion and the second end portion, wherein the first end portion comprises a first upper surface and a first lower surface, the second end portion comprises a second upper surface and a second lower surface, and the half-etched portion comprises a third upper surface and a third lower surface;
   at least one chip disposed on top of the leads, wherein said chip comprises an active surface facing toward the first upper surfaces of the first end portions and a plurality of bumps disposed on the active surface, and wherein the bumps are electrically connected with the lead frame;
   a molding compound covering the chip and the leads, wherein the first lower surface of each of the first end portions and the second lower surface of each of the second end portions are exposed by the molding compound; and
   an anti-conduction film covering the first lower surface of the first end portion of each of the leads directly so as to inhibit the first lower surfaces of the first end portions from electrically connecting another electronic component and such that the anti-conduction film is not electrically connected with the first end portions.

2. The semiconductor package structure in accordance with claim 1 further comprising a plurality of solder electrically connected with the bumps and the lead frame.

3. The semiconductor package structure in accordance with claim 1, wherein the material of the anti-conduction film is a polymer material with high resistance.

4. The semiconductor package structure in accordance with claim 1, wherein the anti-conduction film comprises an exposing surface, and wherein the first upper surface of each of the first end portions and the exposing surface define a first thickness, each of the second end portions defines a second thickness between the second upper surface and the second lower surface, and wherein the first thickness is larger than the second thickness.

5. The semiconductor package structure in accordance with claim 4, wherein each of the half-etched portions defines a third thickness between the third upper surface and the third lower surface, and wherein the second thickness is larger than the third thickness.

6. The semiconductor package structure in accordance with claim 1 further comprising a connection layer formed on the first upper surfaces of the first end portions.

* * * * *